United States Patent [19]

Doan et al.

[11] Patent Number: 5,391,511
[45] Date of Patent: Feb. 21, 1995

[54] SEMICONDUCTOR PROCESSING METHOD OF PRODUCING AN ISOLATED POLYSILICON LINED CAVITY AND A METHOD OF FORMING A CAPACITOR

[75] Inventors: Trung T. Doan; Charles H. Dennison, both of Boise, Id.

[73] Assignee: Micron Technology, Inc., Boise, Id.

[21] Appl. No.: 891

[22] Filed: Jan. 5, 1993

Related U.S. Application Data

[63] Continuation-in-part of Ser. No. 869,615, Apr. 16, 1992, which is a continuation-in-part of Ser. No. 838,537, Feb. 19, 1992, Pat. No. 5,206,183.

[51] Int. Cl.[6] ............................................. H01L 21/265
[52] U.S. Cl. ......................................... 437/49; 437/60; 437/919; 156/636
[58] Field of Search ................... 437/919, 60, 49; 156/636

[56] References Cited

U.S. PATENT DOCUMENTS

| | | | |
|---|---|---|---|
| 3,893,869 | 7/1975 | Mayer et al. | 134/86 |
| 4,543,130 | 9/1985 | Shwartzman | 134/1 |
| 4,736,759 | 4/1988 | Coberly et al. | 134/66 |
| 4,854,337 | 8/1989 | Bunkenburg et al. | 134/184 |
| 4,869,278 | 9/1989 | Bran | 134/184 |
| 5,148,823 | 9/1992 | Bran | 134/184 |
| 5,218,219 | 6/1993 | Ajika et al. | 257/309 |

Primary Examiner—George Fourson
Assistant Examiner—H. Jey Tsai
Attorney, Agent, or Firm—Wells, St. John, Roberts, Gregory & Matkin

[57] ABSTRACT

A semiconductor processing includes: a) providing an area atop a semiconductor wafer to which electrical connection to a polysilicon containing component is to be made; b) providing a layer of first material atop the semiconductor wafer, the first material layer having an upper surface; c) providing a contact opening in the layer of first material to the area, the contact opening having a selected open cross dimension; d) providing a layer of polysilicon to a selected thickness atop the layer of first material and within the contact opening to contact the area, the selected thickness being less than one-half the open dimension such that polysilicon less than completely fills the contact opening and thereby defines an outwardly open polysilicon lined cavity; e) with the wafer having the polysilicon lined cavity outwardly open, chemical mechanical polishing with a chemical mechanical polishing slurry the polysilicon atop the first material layer to the upper first material layer surface to define an isolated polysilicon lined cavity; and f) removing chemical mechanical polishing slurry residuals from the outwardly open polysilicon lined cavity.

4 Claims, 4 Drawing Sheets

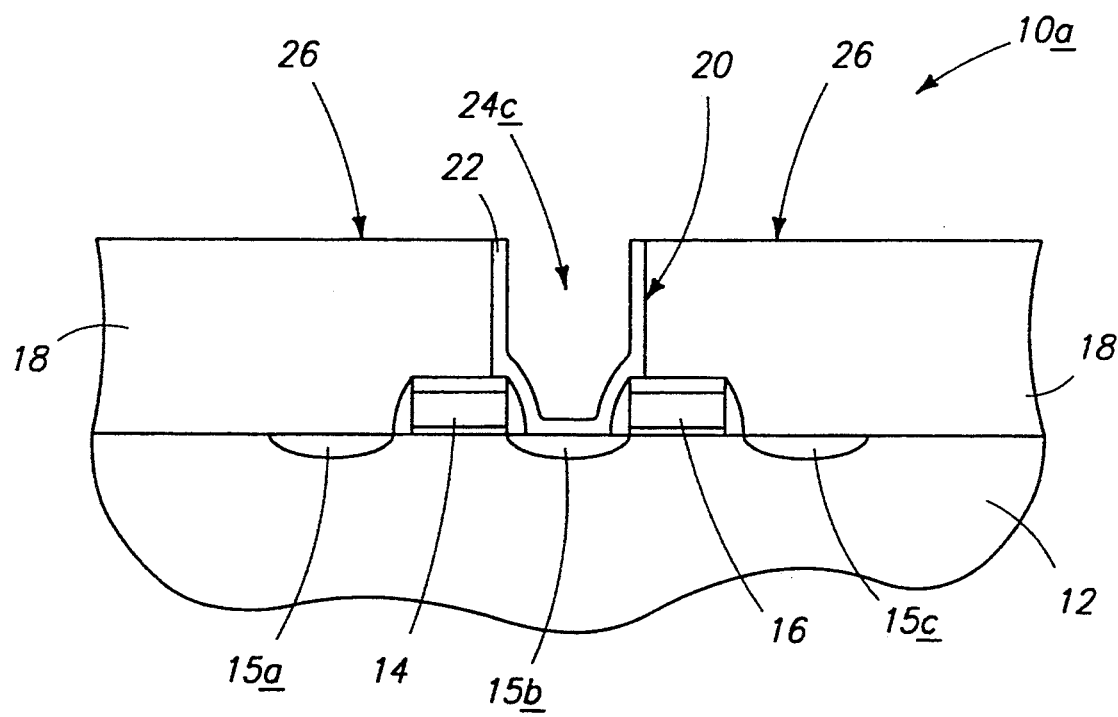
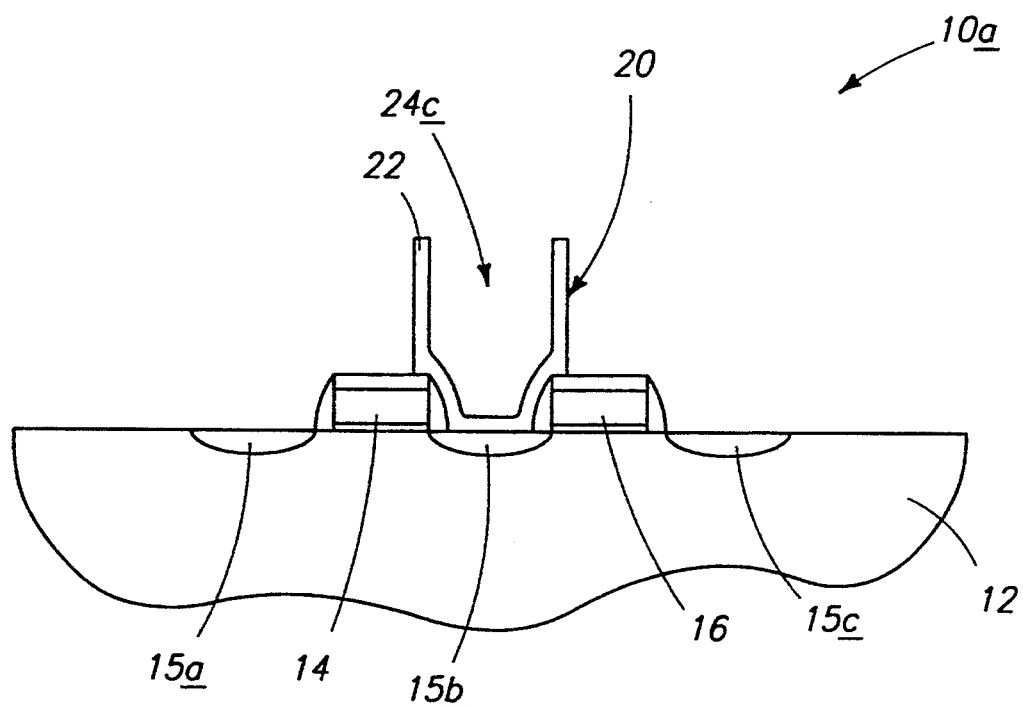

5,391,511

SEMICONDUCTOR PROCESSING METHOD OF PRODUCING AN ISOLATED POLYSILICON LINED CAVITY AND A METHOD OF FORMING A CAPACITOR

RELATED PATENT DATA

This patent resulted from a continuation-in-part application of U.S. patent application Ser. No. 07/869,615 entitled "A Semiconductor Processing Method Of Producing An Isolated Polysilicon Lined Cavity And A Method Of Forming A Capacitor", filed on Apr. 16, 1992. The Ser. No. 07/869,615 application resulted from a continuation-in-part patent application of U.S. patent application Ser. No. 07/838,537 entitled "Method Of Forming A Bit Line Over Capacitor Array Of Memory Cells", filed on Feb. 19, 1992, which is now issued U.S. Pat. No 5,206,183. These patent application Ser. Nos. 07/838,537 and 07/869,615 are hereby incorporated by reference.

TECHNICAL FIELD

This invention relates to semiconductor processing methods of producing isolated polysilicon lined cavities and to methods of forming capacitors.

BACKGROUND OF THE INVENTION

As DRAMs increase in memory cell density, there is a continuous challenge to maintain sufficiently high storage capacitance despite decreasing cell area. A principal way of increasing cell capacitance is through cell structure techniques. Such techniques include three dimensional cell capacitors such as trenched or stacked capacitors. This invention concerns stacked capacitor cell constructions employing conductively doped polysilicon as one of the storage nodes. This invention also concerns semiconductor processing methods of producing isolated polysilicon lined cavities.

BRIEF DESCRIPTION OF THE DRAWINGS

Preferred embodiments of the invention are described below with reference to the following accompanying drawings.

FIG. 3 is a view of the FIG. 1 wafer at a processing step subsequent to that shown by FIG. 2.

FIG. 4 is a view of the FIG. 1 wafer at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
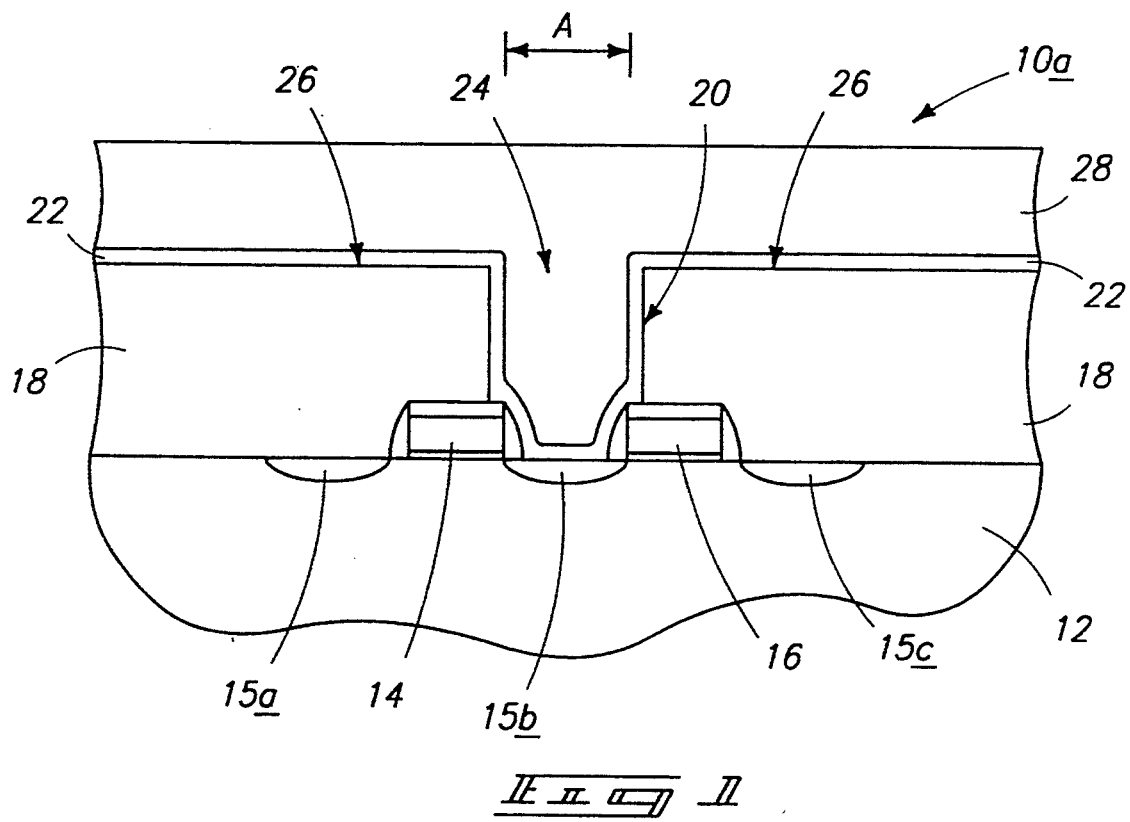
FIG. 1 is a diagrammatic sectional view of a semiconductor wafer fragment.

FIGS. 1–4 illustrate a process not in accordance with this invention. This invention is intended to overcome some of the added process complexity inherent in the FIGS. 1–4 process, and is provided for background information. Specifically, FIG. 1 illustrates a semiconductor wafer fragment 10a comprised of a bulk substrate 12 and word lines 14, 16. Bulk substrate 12 is provided with active areas 15a, 15b and 15c, with area 15b constituting an area to which electrical connection to a polysilicon containing component is to be made. An insulating dielectric layer 18, having an upper surface 26, is provided atop bulk substrate 12 and over word lines 14, 16. The material of layer 18 is selectively etchable relative to polysilicon, and preferably comprises a $SiO_2$ material. An alternate example would be a nitride material. A contact opening 20 having a selected open cross dimension "A" is provided in insulating dielectric layer 18 to selected active area 15b.

A layer 22 of polysilicon is deposited to a selected thickness atop layer 18 of first material and within contact opening 20 to contact area 15b. The selected thickness of polysilicon layer 22 is something less than one-half open cross dimension (diameter) "A" such that polysilicon less than completely fills contact opening 20, and thereby defines an outwardly open polysilicon lined cavity/container 24. Polysilicon layer 22 will ultimately be used for formation of an electrically conductive polysilicon containing component and, accordingly, can be in situ conductively doped or subjected to a subsequent conductive doping step.

Wafer fragment 10a is liquid spin coated with a second material to define a layer 28 which completely fills polysilicon lined cavity 24 with second material. The second material is selectively etchable relative to polysilicon for subsequent sacrificial removal from the wafer. Example materials include polyimide and photoresist.

Figure 2:
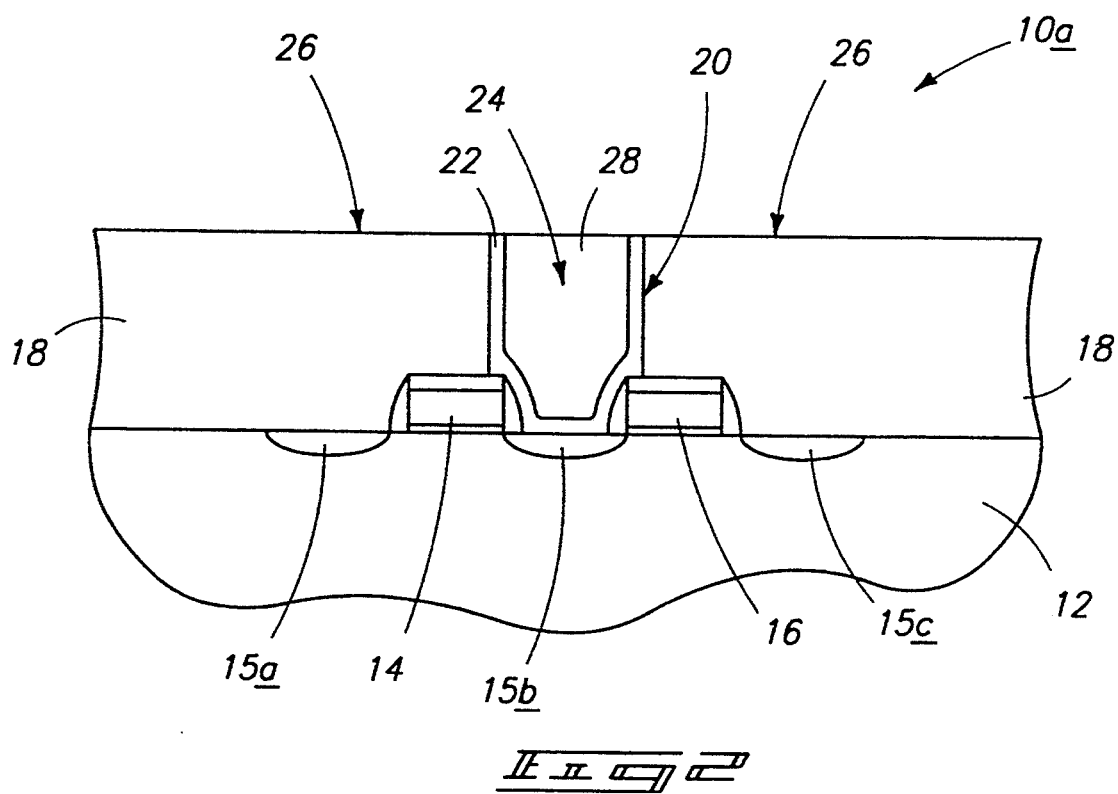
FIG. 2 is a view of the FIG. 1 wafer at a processing step subsequent to that shown by FIG. 1.

Referring to FIG. 2, second material layer 28 and polysilicon layer 22 are chemically mechanically polished to upper first material layer surface 26. During such polishing, it will be noted that second material 28 completely filled outwardly open polysilicon lined cavity 24 such that no CMP slurry can get into cavity 24.

Referring to FIG. 3, second material layer 28 which was remaining within cavity 24 is etched from the wafer selectively relative to polysilicon, leaving an isolated polysilicon lined cavity 24c. Referring to FIG. 4, oxide layer 18 is etched from the wafer, leaving isolated polysilicon lined cavity 24c projecting upwardly from and electrically connecting with active area 15b. Such a construction might be utilized to form a capacitor. As will be appreciated by the artisan, the deposition and subsequent removal of material 28 adds steps to the process.

In accordance with one aspect of the invention, a semiconductor processing method comprises:

providing an area atop a semiconductor wafer to which electrical connection to a polysilicon containing component is to be made;

providing a layer of first material atop the semiconductor wafer, the first material layer having an upper surface;

providing a contact opening in the layer of first material to the area, the contact opening having a selected open cross dimension;

providing a layer of polysilicon to a selected thickness atop the layer of first material and within the contact opening to contact the area, the selected thickness being less than one-half the open dimension such that polysilicon less than completely fills the contact opening and thereby defines an outwardly open polysilicon lined cavity;

with the wafer having the polysilicon lined cavity outwardly open, chemical mechanical polishing (CMP) with a chemical mechanical polishing slurry the polysilicon atop the first material layer to the upper first material layer surface to define an isolated polysilicon lined cavity; and removing chemical mechanical polishing slurry residuals from the outwardly open polysilicon lined cavity.

Figure 5:
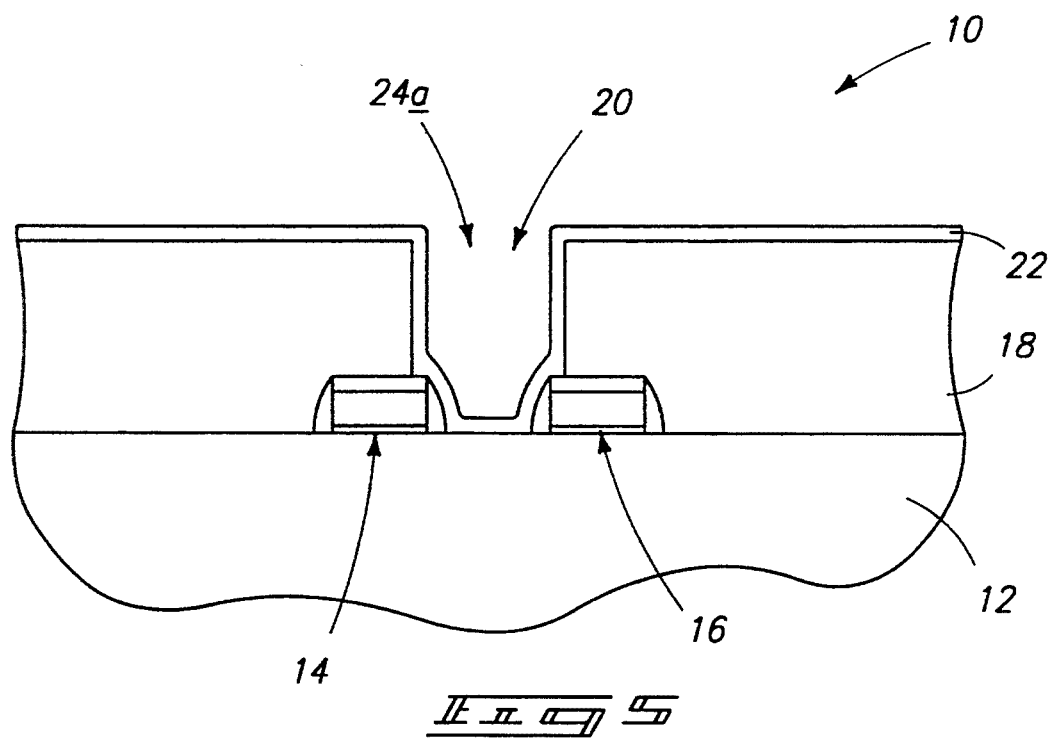
FIG. 5 is a diagrammatic sectional view of a semiconductor wafer fragment processed in accordance with the invention.
Figure 6:
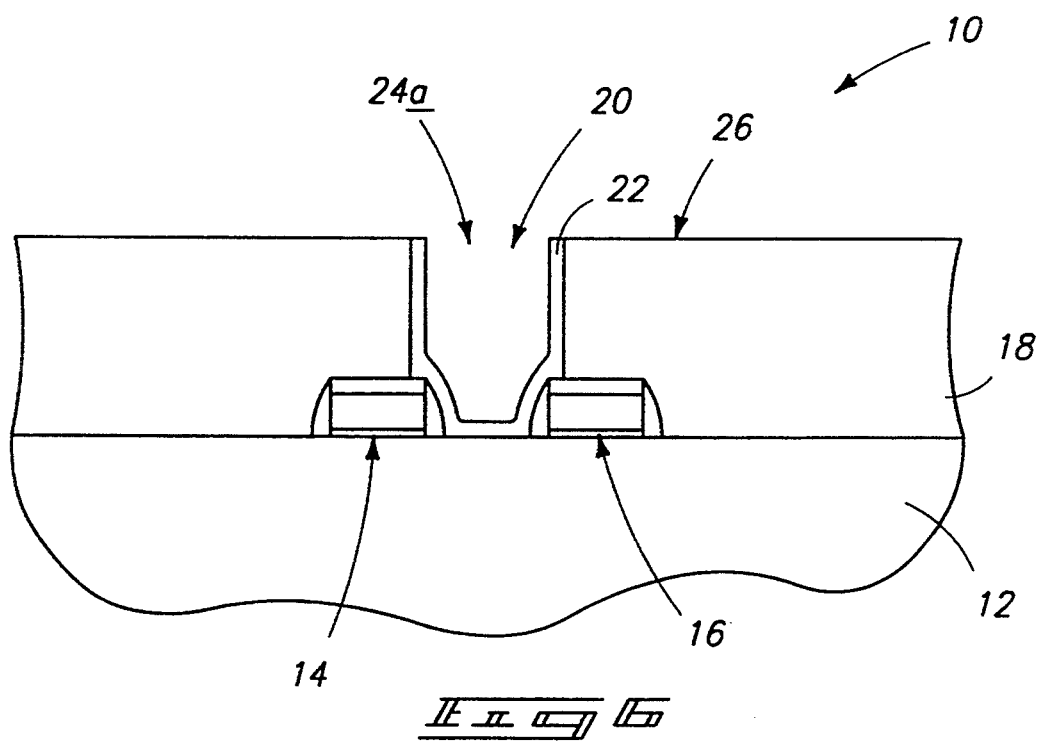
FIG. 6 is a view of the FIG. 5 wafer at a processing step subsequent to that shown by FIG. 5.

More particularly and with reference first to FIGS. 5-6, FIG. 5 illustrates a semiconductor wafer fragment 10 analogous to the wafer fragment 10a depicted in FIGS. 1-4. Like numbers from the FIGS. 1-4 embodiment are utilized in the described FIGS. 5-8 embodiment. Specifically, layer 22 of polysilicon is provided for formation of isolated polysilicon lined cavities the preferred intended use of which will be to form isolated polysilicon capacitor storage nodes.

Referring to FIG. 6, wafer fragment 10 (having polysilicon lined cavity/container 24a outwardly open) is subjected to a chemical mechanical polishing technique which is conducted to at least the point of stopping at upper surface 26 of layer 18. An example slurry would be the SCI slurry, available from Rodel Products Corporation of Newark, Del. Such slurry comprises KOH, $SiO_2$ particles and water. A typical CMP polish time would be from about 1 to 2 minutes. Such a technique would produce an isolated polysilicon lined cavity 24a, and would typically leave slurry residual, including $SiO_2$ grit, inside the cavity. Such slurry residuals would then be removed from cavity 24a.

The preferred technique for removing such residual, and the method by which the invention was reduced to practice, is by a combination of spraying the wafer with a cleaning fluid under pressure, followed by megasonic cleaning of the wafer. The preferred cleaning fluid is highly purified water, such as reverse osmosis purified water. The fluid is preferably sprayed onto the wafer at a pressure of at least 200 psi. An example spraying treatment time would be for forty-five seconds at room temperature and pressure conditions.

Where the CMP slurry included $SiO_2$ grit, the megasonic cleaning step preferably employs a cleaning solution comprising KOH and $H_2O_2$ in which $SiO_2$ grit is soluble under megasonic conditions to dissolve away remaining $SiO_2$ grit from within the cavity. Preferably, the pH of the cleaning solution is at least 13. The pH of a KOH CMP slurry is typically around 12. An example megasonic treatment time would be for five minutes at room temperature and pressure conditions. KOH and $H_2O_2$ solution under megasonic conditions dissolves $SiO_2$ grit, thus facilitating its removal from within the polysilicon cavities. The megasonic conditions enhances the solubility of $SiO_2$ in a mixture of KOH and $H_2O_2$.

Figure 7:
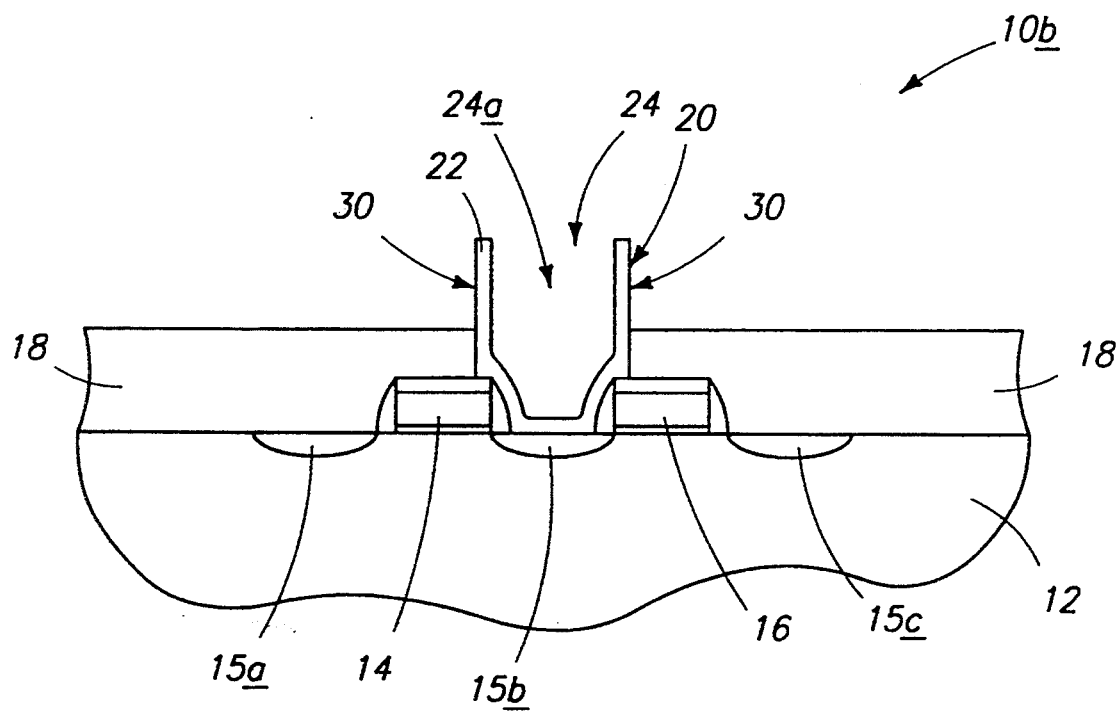
FIG. 7 is a view of the FIG. 5 wafer at a processing step subsequent to that shown by FIG. 6.

Further $SiO_2$ grit removal can be facilitated by an HF dip, which can also be utilized to provide the added functional benefit of etching $SiO_2$. For example where layer 18 is comprised principally of $SiO_2$, such a dip also will etch this layer to expose outer sidewalls of the cavity container 24a. Referring to FIG. 7, wafer 10b is dipped in a HF solution for a time sufficient to expose at least a portion of the outer sidewalls of container/cavity 24. Such sidewalls are designated by numeral 30. An example concentration range for HF concentration would be from 5:1 to 100:1, by volume, with the larger numeral representing quantity of a 49% HF solution by volume and the "1" representing volume of water. The HF solution in addition to etching $SiO_2$ (not polysilicon) will facilitate removing $SiO_2$ grit by etching action which might remain after the high pressure wash and megasonic cleaning.

Techniques other than megasonic cleaning might also be employed. By way of example only, ultrasonic cleaning could be utilized or cleaning with frequencies even higher than megasonic frequencies. Other techniques are also expected to be usable to remove chemical mechanical polishing slurry residuals from the outwardly open polysilicon lined cavity.

Figure 8:
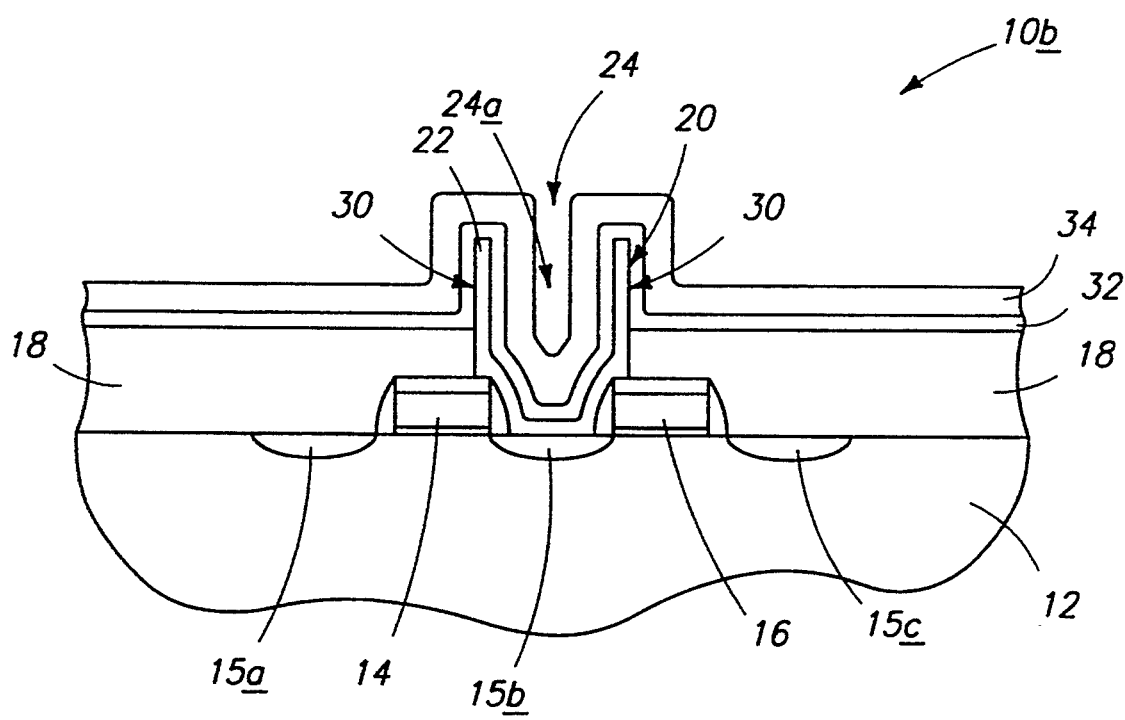
FIG. 8 is a view of the FIG. 5 wafer at a processing step subsequent to that shown by FIG. 7.

FIG. 8 illustrates continuing the process for forming a capacitor on a semiconductor wafer. Here, a conformal capacitor dielectric layer 32 is provided atop the isolated polysilicon storage node within container/cavity 24a and over the exposed storage node outer side walls 30. Thereafter, a conformal conductive capacitor plate layer 34 is provided atop capacitor dielectric layer 32. The preferred material for layer 34 is conductively doped polysilicon, leaving the illustrated capacitor construction. Layers 34 and 32 could of course be patterned as desired to define a finished capacitor shape.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method comprising:

providing an area atop a semiconductor wafer to which electrical connection to a polysilicon containing component is to be made;

providing a layer of first material atop the semiconductor wafer, the first material layer having an upper surface;

providing a contact opening in the layer of first material to the area, the contact opening having a selected open diameter;

providing a layer of polysilicon to a selected thickness atop the layer of first material and within the contact opening to contact the area, the selected thickness being less than one-half the open diameter such that polysilicon less than completely fills the contact opening and thereby defines an outwardly open polysilicon lined cavity;

with the wafer having the polysilicon lined cavity outwardly open, chemical mechanical polishing with a chemical mechanical polishing slurry the polysilicon atop the first material layer to the upper first material layer surface to define an isolated polysilicon lined cavity;

removing chemical mechanical polishing slurry residuals from the outwardly open polysilicon lined cavity; and wherein the first material comprises $SiO_2$, the chemical mechanical polishing slurry comprises $SiO_2$ grit, the isolated polysilicon lined cavity has outer sidewalls, and the method further comprising dipping the wafer with the isolated polysilicon lined cavity into an HF solution to remove SiO$_2$ grit from within the cavity and to etch the first material and thereby expose at least a portion of the cavity outer sidewalls.

2. A semiconductor processing method comprising:
providing an area atop a semiconductor wafer to which electrical connection to a polysilicon containing component is to be made;
providing a layer of first material atop the semiconductor wafer, the first material layer having an upper surface;
providing a contact opening in the layer of first material to the area, the contact opening having a selected open diameter;
providing a layer of polysilicon to a selected thickness atop the layer of first material and within the contact opening to contact the area, the selected thickness being less than one-half the open diameter such that polysilicon less than completely fills the contact opening and thereby defines an outwardly open polysilicon lined cavity;
with the wafer having the polysilicon lined cavity outwardly open, chemical mechanical polishing with a chemical mechanical polishing slurry the polysilicon atop the first material layer to the upper first material layer surface to define an isolated polysilicon lined cavity; and
spraying the wafer with a cleaning fluid under pressure followed by megasonic cleaning the wafer to remove chemical mechanical polishing slurry residuals from the outwardly open polysilicon lined cavity, and wherein,
the cleaning fluid consists essentially of water purified by reverse osmosis;
the chemical mechanical polishing slurry comprises SiO$_2$ grit, and the megasonic cleaning step employs a cleaning solution comprising KOH and H$_2$O$_2$ in which SiO$_2$ grit is soluble under megasonic conditions to dissolve away SiO$_2$ grit from within the cavity; and
the first material comprises SiO$_2$, the chemical mechanical polishing slurry comprises SiO$_2$ grit, the isolated polysilicon lined cavity has outer sidewalls, and the method further comprising dipping the wafer with the isolated polysilicon lined cavity into an HF solution to remove SiO$_2$ grit from within the cavity and to etch the first material and thereby expose at least a portion of the cavity outer sidewalls.

3. A method of forming a capacitor on a semiconductor wafer comprising the following steps:
providing an area atop a semiconductor wafer to which electrical connection to a storage node of a capacitor is to be made;
providing a layer of first material atop the semiconductor wafer, the first material layer having an upper surface and being selectively etchable relative to polysilicon;
providing a contact opening in the layer of first material to the area, the contact opening having a selected open diameter;
providing a layer of polysilicon to a selected thickness atop the layer of first material and within the contact opening to contact the area, the selected thickness being less than one-half the open diameter such that polysilicon less than completely fills the contact opening and thereby defines an outwardly open polysilicon lined cavity;
with the wafer having the polysilicon lined cavity outwardly open, chemical mechanical polishing with a chemical mechanical polishing slurry, the polysilicon atop the first material layer to the upper first material layer surface to define an isolated capacitor storage node container, the isolated storage node container having outer sidewalls;
spraying the wafer with a cleaning fluid under pressure followed by megasonic cleaning the wafer to remove chemical mechanical polishing slurry residuals from the outwardly open polysilicon container;
etching the first material layer selectively relative to polysilicon sufficiently to expose at least a portion of the storage node container outer sidewalls;
providing a conformal capacitor dielectric layer atop the isolated storage node within the container and over the exposed storage node outer sidewalls;
providing a conformal conductive capacitor plate layer atop the capacitor dielectric layer; and wherein,
the first material comprises SiO$_2$, the chemical mechanical polishing slurry comprises SiO$_2$ grit, the isolated polysilicon lined cavity has outer sidewalls, and the method further comprising dipping the wafer with the isolated polysilicon lined cavity into an HF solution to remove SiO$_2$ grit from within the cavity and to etch the first material and thereby expose at least a portion of the cavity outer sidewalls.

4. A method of forming a capacitor on a semiconductor wafer comprising the following steps:
providing an area atop a semiconductor wafer to which electrical connection to a storage node of a capacitor is to be made;
providing a layer of first material atop the semiconductor wafer, the first material layer having an upper surface and being selectively etchable relative to polysilicon;
providing a contact opening in the layer of first material to the area, the contact opening having a selected open diameter;
providing a layer of polysilicon to a selected thickness atop the layer of first material and within the contact opening to contact the area, the selected thickness being less than one-half the open diameter such that polysilicon less than completely fills the contact opening and thereby defines an outwardly open polysilicon lined cavity;
with the wafer having the polysilicon lined cavity outwardly open, chemical mechanical polishing with a chemical mechanical polishing slurry the polysilicon atop the first material layer to the upper first material layer surface to define an isolated capacitor storage node container, the isolated storage node container having outer sidewalls;
removing chemical mechanical polishing slurry residuals from the outwardly open polysilicon container;
etching the first material layer selectively relative to polysilicon sufficiently to expose at least a portion of the storage node container outer sidewalls;
providing a conformal capacitor dielectric layer atop the isolated storage node within the container and over the exposed storage node outer sidewalls;
providing a conformal conductive capacitor plate layer atop the capacitor dielectric layer; and wherein the first material comprises $SiO_2$, the chemical mechanical polishing slurry comprises $SiO_2$ grit, the isolated polysilicon lined cavity has outer sidewalls, and the method further comprising dipping the wafer with the isolated polysilicon lined cavity into an HF solution to remove $SiO_2$ grit from within the cavity and to etch the first material and thereby expose at least a portion of the cavity outer sidewalls.

* * * * *